(12) United States Patent
Yano et al.

(10) Patent No.: US 6,375,545 B1
(45) Date of Patent: Apr. 23, 2002

(54) CHEMICAL MECHANICAL METHOD OF POLISHING WAFER SURFACES

(75) Inventors: Hiroyuki Yano; Gaku Minamihaba; Yukiteru Matsui; Nobuo Hayasaka; Katsuya Okumura, all of Yokohama; Akira Iio, Tokyo; Masayuki Hattori, Tokyo; Masayuki Motonari, Tokyo, all of (JP)

(73) Assignees: Kabushiki Kaisha Toshiba, Kawasaki; JSR Corporation, Tokyo, both of (JP)

( * ) Notice: Subject to any disclaimer, the term of this patent is extended or adjusted under 35 U.S.C. 154(b) by 0 days.

(21) Appl. No.: 09/484,252

(22) Filed: Jan. 18, 2000

(30) Foreign Application Priority Data

Jan. 18, 1999 (JP) .......................................... 11-009901
Jan. 18, 1999 (JP) .......................................... 11-009904
Jan. 18, 1999 (JP) .......................................... 11-009905

(51) Int. Cl.$^7$ ................................................ B24B 1/00
(52) U.S. Cl. .......................................... 451/36; 451/41
(58) Field of Search ...................... 216/88, 89; 438/692, 438/693; 451/36, 41, 57, 60, 63; 252/79.1

(56) References Cited

U.S. PATENT DOCUMENTS

| | | | |
|---|---|---|---|
| 5,705,559 A | | 1/1998 | Sakamoto et al. |
| 5,775,980 A | * | 7/1998 | Sasaki et al. ................ 451/285 |
| 5,814,113 A | * | 9/1998 | Neuland ...................... 51/298 |
| 5,865,902 A | * | 2/1999 | Yam et al. ..................... 134/7 |
| 5,876,490 A | * | 3/1999 | Ronay .......................... 106/3 |
| 5,934,978 A | * | 8/1999 | Burke et al. .................. 451/36 |
| 6,165,239 A | * | 12/2000 | Hedrick et al. ............... 51/295 |
| 6,197,951 B1 | * | 3/2001 | Lenz ....................... 536/123.1 |

FOREIGN PATENT DOCUMENTS

| | | |
|---|---|---|
| EP | 1 077 240 | 2/2001 |
| JP | 7-86216 | 3/1995 |
| JP | 9-246852 | 9/1997 |
| JP | 9-285957 | 11/1997 |
| JP | 10-168431 | 6/1998 |
| JP | 10-231473 | 9/1998 |
| JP | 10-270400 | 10/1998 |

OTHER PUBLICATIONS

Derwent Publications, AN 1992–212794, JP 04 141202, May 14, 1992.

* cited by examiner

*Primary Examiner*—Timothy V. Eley
(74) *Attorney, Agent, or Firm*—Oblon, Spivak, McClelland, Maier & Neustadt, P.C.

(57) ABSTRACT

It is an object of the present invention to provide an aqueous dispersion and CMP slurry that can achieve polishing at an adequate rate without producing scratches in the polishing surfaces of wafer working films, and a polishing process for wafer surfaces and a process for manufacture of a semiconductor device using them. A CMP slurry and the like of the present invention contains polymer particles with a crosslinked structure and a mean particle size of 0.13–0.8 $\mu$m. The CMP slurry may contain no surfactant, and may contain the surfactant of not greater than 0.15 wt %. A CMP slurry and the like of another present invention contains polymer particles and inorganic particles of silica, aluminum and the like. A mean particle size of the polymer particles may be not greater than a mean particle size of the inorganic particles. And the mean particle size of the inorganic coagulated particles may be 0.1–1.0 $\mu$m, and may be smaller than the mean particle size of the polymer particles. The CMP slurry is used as a polishing agent and a working film of a silicon oxide film, an aluminum film, a tungsten film or a copper film formed on a wafer is polished. And a semiconductor device is manufactured by using the CMP slurry.

17 Claims, No Drawings

CHEMICAL MECHANICAL METHOD OF POLISHING WAFER SURFACES

BACKGROUND OF THE INVENTION

1. Technical Field of the Invention

The present invention relates to an aqueous dispersion with excellent moisture resistance, insulation properties, antistatic properties, heat resistance, color fastness and the like, which contains polymer particles with suitable hardness and strength and which has a specific limited surfactant content. Another invention further relates to an aqueous dispersion composition for chemical mechanical polishing used for wafer polishing (hereunder referred to as "dispersion composition" or "CMP slurry") that contains specific polymer particles, or to a CMP slurry that has a specific limited surfactant content, to particularly a CMP slurry for chemical mechanical polishing used for wafer polishing.

Further, another invention relates to an aqueous dispersion containing polymer particles with a specified mean particle size. Further another invention relates to a CMP slurry with above-mentioned aqueous dispersion, to particularly a CMP slurry which is useful for chemical machine polishing of working films. Further another invention relates to a polishing process comprising a step of polishing a wafer working film with above-mentioned specific CMP slurry. And another invention relates to a process for manufacture of a semiconductor device using the CMP slurry.

2. Prior Art

Aqueous dispersions containing fine polymer particles are used, or are being studied for use, as electronic materials, polishing materials, coating materials, paints, optical materials, catalysts, photocatalysts, electronic material film lubricants, diagnostic agents, drugs, cosmetics, conductive materials, inks, CMP slurries and the like. However, conventional aqueous dispersions have presented the following problems when applied for these purposes.

(a) Because they contain impurities such as surfactants, they can result in quality reduction when applied for these purposes.

(b) Because the antistatic properties, heat resistance, color fastness, and the like of the polymer particles are not always adequate, their use is limited depending on the purpose.

(c) Their uses are also limited because the hardness of the polymer particles is low and their strength is insufficient.

While the use of aqueous dispersions containing inorganic particles has also been studied, inorganic particles present problems because their hardness is too hard and particles with uniform shapes are difficult to obtain.

The higher integration of LSIs in recent years has led to the development of a variety of different fine working techniques. For example, the minimum working dimensions for patterns are becoming smaller year by year, and at the current time they have already reached the submicron level. A variety of techniques such as chemical mechanical polishing (hereunder, "CMP") have also been developed to meet the stringent demands of such fine working. CMP is an essential technique for planarizing of working film surfaces such as interlayer insulation films, formation of plugs, formation of molded-in metal wiring, separation of molded-in elements, and the like.

Aqueous dispersions containing abrasive particles made of metal oxides have conventionally been used as polishing materials in CMP. However, these abrasive particles have high hardness and have therefore presented the problem of creating scratches on polishing wafer surfaces. These scratches generated during the CMP process are not desirable because they lower the reliability of the LSI.

Improvements in wafer integration, increased multilayer wirings, and the like have led to the introduction of CMP techniques for polishing of working films and the like. As disclosed in Japanese Laid-Open Patent Publication Nos. shou-62-102543, shou-64-55845 and hei-5-275366, Japanese Patent Public Inspection No. hei-8-510437, Japanese Laid-Open Patent Publication Nos. hei-8-17831, hei-8-197414, and hei-10-44047 and elsewhere, there is known a type of process whereby a wiring material such as tungsten, aluminum, copper or the like is embedded in a hole or groove formed in an insulating film on a processing wafer and then polishing is performed to remove the excess wiring material to thereby form the wiring.

In this CMP process, aqueous dispersions containing metal oxide abrasive particles have traditionally been used as polishing materials. However, these abrasive particles have high hardness and have, therefore, presented the problem of creating nicks on polishing wafer surfaces. These nicks generated during the CMP process are not desirable because they lower the reliability of the LSI. In order to prevent such nicks, Japanese Laid-Open Patent Publication No. 9-285957 has proposed a polishing material having abrasive particles made of colloidal silica or the like, with the inclusion of scratch-preventing particles made of polyurethane resin or the like, having a larger size than the abrasive particles. However, when polishing materials containing such large-sized, low hardness scratch-preventing particles are used, this has presented the problem of a vastly reduced polishing rate compared to polishing materials containing abrasive particles made of metal oxides.

Japanese Laid-Open Patent Publication No. 7-86216 describes a polishing material (particularly CMP slurry) containing abrasive particles composed mainly of an organic polymer compound or the like instead of abrasive particles made of a metal oxide. It is explained that using the polishing material for polishing of wafer working films can prevent generation of nicks in the polishing wafer surface. However, abrasive particles made of this organic polymer compound have low hardness, and polishing materials composed mainly of these abrasive particles also give vastly lower polishing rates compared to polishing materials containing abrasive particles made of metal oxides.

Thus, the inventions described in these patent publications cannot achieve highly reliable high-speed polishing of working films for manufacture of semiconductor device (including various devices (wafers, device comprising wafer and the like)), nor do they allow efficient manufacture of wafers.

PROBLEMS TO BE SOLVED BY THE INVENTION

It is an object of the present invention to provide an aqueous dispersion and a CMP slurry with excellent moisture resistance, insulation properties, antistatic properties, heat resistance, color fastness and the like, which contains polymer particles with suitable hardness and strength, has few impurities such as surfactants, and is useful for such purposes as electronic materials, polishing materials, paints, drugs, inks and the like, as well as for polishing of magnetic disks, wafers and the like.

Further, it is another object of the present invention to provide a CMP slurry used for polishing of wafers, that can achieve polishing at an adequate rate without producing scratches in the polishing surfaces of wafer working films.

It is yet another object of the present invention to provide a polishing process for wafer surfaces that comprises a step of polishing working films on wafers using the CMP slurry. Further, it is another object of the invention to provide a manufacturing process of a semiconductor device using the CMP slurry.

SUMMARY OF THE INVENTION

According to the present invention, the aforementioned objects of the invention are achieved by providing the following aqueous Dispersion, CMP slurry, a polishing Process for Wafer Surfaces, and a process for manufacture of a semiconductor device.

An aqueous dispersion characterized by containing polymer particles with a crosslinked structure and a mean particle size of 0.13–0.8 µm.

An aqueous dispersion according to claim 1, wherein said polymer is produced by copolymerization of 5–80 wt % of a crosslinkable monomer and 20–95 wt % of another monomer.

An aqueous dispersion according to claim 2, wherein a surfactant is also contained, and said surfactant content is no greater than 0.15 wt %.

An aqueous, wherein said polymer particles have a hydrophilic group.

An aqueous dispersion, wherein said hydrophilic group is at least one from among hydroxyl, carboxyl groups and salts thereof, acid anhydride groups, sulfonic acid groups and salts thereof, phosphoric acid groups and salts thereof, and amino groups and salts thereof.

An aqueous dispersion, wherein further an oxidizing agent and/or a polyvalent metal ion is also included.

An aqueous dispersion, characterized by containing polymer particles and inorganic particles, wherein a mean particle size of said polymer particles is not more than a mean particle size of said inorganic particles.

An aqueous dispersion, wherein said mean particle size of said polymer particles is at least 0.1 µm and less than 0.7 µm, said mean particle size of said inorganic particles is greater than 0.1 µm and no greater than 0.7 µm, and a ratio of said mean particle size of said polymer particles and said mean particle size of said inorganic particles (Sp/Si ratio) is 0.05–0.85.

An aqueous dispersion, characterized by containing polymer particles and inorganic particles, wherein the mean particle size of said inorganic particles is 0.1–1.0 µm, and is smaller than the mean particle size of said polymer particles.

An aqueous dispersion, wherein a ratio of said mean particle size of said polymer particles (Sp) and a mean particle size of said inorganic particles (Si) (Sp/Si ratio) is 1.1–20.

A CMP slurry, characterized by containing polymer particles with a crosslinked structure and a mean particle size of 0.13–0.8 µm.

A CMP slurry, wherein said polymer is produced by copolymerization of 5–80 wt % of a crosslinkable monomer and 20–95 wt % of another monomer.

A CMP slurry, wherein a surfactant is further included, with the surfactant content being no greater than 0.15 wt %.

A CMP slurry, wherein said surfactant content is no greater than 0.05 wt %.

A CMP slurry, wherein said polymer particles have a hydrophilic group.

A CMP slurry, wherein said hydrophilic group is at least one from among hydroxyl, carboxyl groups and salts thereof, acid anhydride groups, sulfonic acid groups and salts thereof, phosphoric acid groups and salts thereof, and amino groups and salts thereof.

A CMP slurry, wherein an oxidizing agent and/or a polyvalent metal ion is also included.

A CMP slurry, wherein an organic acid is also included.

A CMP slurry, characterized by containing polymer particles and inorganic particles, wherein a mean particle size of said polymer particles is not more than a mean particle size of said inorganic particles.

A CMP slurry, wherein said mean particle size of said polymer particles is not less than 0.01 µm and less than 5 µm, and said mean particle size of said inorganic particles is greater than 0.01 µm and not more than 5 µm.

A CMP slurry, wherein said ratio of said mean particle size of said polymer particles (Sp) and said mean particle size of said inorganic particles (Si) (Sp/Si ratio) is 0.01–0.95.

A CMP slurry, wherein said mean particle size of said polymer particles is not less than 0.1 µm and less than 0.7 µm, said mean particle size of said inorganic particles is greater than 0.1 µm and not more than 0.7 µm, and said ratio of said mean particle size of said polymer particles and said mean particle size of said inorganic particles (Sp/Si ratio) is 0.05–0.85.

A CMP slurry, wherein further an oxidizing agent and/or a polyvalent metal ion are/is contained.

A CMP slurry, which further contains an organic acid.

A CMP slurry, characterized by containing polymer particles and inorganic particles, wherein said mean particle size of said inorganic particles is 0.1–1.0 µm, and is smaller than said mean particle size of said polymer particles.

A CMP slurry, wherein said ratio of said mean particle size of said polymer particles (Sp) and said mean particle size of said inorganic particles (Si) (Sp/Si ratio) is 1.1–20.

A CMP slurry, wherein said mean particle size of said inorganic particles is 0.15–0.4 µm, and said Sp/Si ratio is 1.1–5.

A CMP slurry, which further contains an oxidizing agent and/or a polyvalent metal ion.

A CMP slurry, which further contains an organic acid.

A polishing process for wafer surfaces characterized by using a CMP slurry that contains polymer particles with a crosslinked structure and a mean particle size of 0.13–0.8 µm, for polishing of a working film formed on a wafer surface.

A polishing process for wafer surfaces, wherein said polymer is produced by copolymerization of 5–80 wt % of a crosslinkable monomer and 20–95 wt % of another monomer.

A polishing process for wafer surfaces, wherein said surfactant content is no greater than 0.05 wt %.

A polishing process for wafer surfaces, wherein said polymer particles have a hydrophilic group.

A polishing process for wafer surfaces, wherein said hydrophilic group is at least one from among hydroxyl, carboxyl groups and salts thereof, acid anhydride groups, sulfonic acid groups and salts thereof, phosphoric acid groups and salts thereof, and amino groups and salts thereof.

A polishing process for wafer surfaces, wherein said CMP slurry also contains an oxidizing agent and/or a polyvalent metal ion.

A polishing process for wafer surfaces, wherein said CMP slurry also contains an organic acid.

A polishing process for wafer surfaces, wherein said working film is a silicon oxide film, amorphous silicon film, polycrystalline silicon film, single-crystal silicon film, silicon nitride film, pure tungsten film, pure aluminum film, pure copper film, an alloy film of tungsten, aluminum or copper with another metal, or a tantalum or titanium oxide or nitride film, formed on a wafer.

A polishing process for wafer surfaces characterized by using a CMP slurry which contains polymer particles and inorganic particles, wherein a mean particle size of said polymer particles is not more than a mean particle size of said inorganic particles, for polishing of a working film formed on a wafer surface.

A polishing process for wafer surfaces, wherein said mean particle size of said polymer particles is not less than 0.01 µm and less than 5 µm, and said mean particle size of said inorganic particles is greater than 0.01 µm and not more than 5 µm.

A polishing process for wafer surfaces, wherein said working film is a silicon oxide film, amorphous silicon film, polycrystalline silicon film, single-crystal silicon film, silicon nitride film, pure tungsten film, pure aluminum film, pure copper film, an alloy film of tungsten, aluminum or copper with another metal, or a tantalum or titanium oxide or nitride film, formed on a wafer.

A polishing process for wafer surfaces, wherein said CMP slurry further contains an oxidizing agent and/or polyvalent metal ion.

A polishing process for wafer surfaces, wherein said CMP slurry further contains an organic acid.

A process for manufacture of a semiconductor device characterized by manufacturing a semiconductor device by using a CMP slurry which contains polymer particles with a crosslinked structure and a mean particle size of 0.13–0.8 µm.

A process for manufacture of a semiconductor device polishing, wherein a surfactant is further included, with the surfactant content being no greater than 0.15 wt %.

A process for manufacture of a semiconductor device characterized by manufacturing a semiconductor device by using a CMP slurry which contains polymer particles and inorganic particles, wherein a mean particle size of said polymer particles is not more than a mean particle size of said inorganic particles.

A process for manufacture of a semiconductor device characterized by manufacturing a semiconductor device by using a CMP slurry which contains polymer particles and inorganic particles, wherein said mean particle size of said inorganic particles is 0.1–1.0 µm, and is smaller than said mean particle size of said polymer particles.

EFFECT OF THE INVENTION

According to the aqueous dispersion of the present invention, it is possible to obtain aqueous dispersions with excellent moisture resistance, insulation properties, antistatic properties, heat resistance and color fastness, which contain polymer particles with suitable hardness and strength and few impurities, and which are useful for electronic materials, polishing materials, coating materials, paints, optical materials, catalysts, photocatalysts, electronic material film lubricants, diagnostic agents, drugs, cosmetics, conductive materials, inks and the like.

Aqueous dispersions containing hydrophilic polymer particles according to another present invention are particularly useful for such purposes as electronic materials, polishing materials and the like.

Further, according to a aqueous dispersion of the present invention it is also possible to obtain various polishing materials (particularly CMP slurry) that provide sufficient polishing rates without creating scratches on polishing wafer surfaces. That is, the aqueous dispersion of the present invention is particularly suitable for use as a "polishing material" as mentioned above. The polishing material (particularly CMP slurry) has excellent heat resistance and employs polymer particles with suitable hardness and strength as the abrasive grits, thus allowing polishing of magnetic disk plates and the like at adequate rates without creating scratches on the polishing surfaces.

The polishing material (particularly CMP slurry) may be one that contains the aqueous dispersion as the main component. Here, "main component" means that the aqueous dispersion is present at 85 wt % or greater, and especially 90 wt % or greater, while the polishing material may also contain prescribed amounts of a polishing accelerator or the like.

The CMP slurry of the present invention may be used as polishing material for polishing of working films on wafers to provide a high polishing rate without creating nicks in the wafer polishing surfaces. According to the polishing process of the present invention it is possible to accomplish high quality polishing at a high polishing rate, and without creating nicks in wafer polishing surfaces. The polishing process, therefore, allows efficient manufacture of high-quality wafers.

The present invention also makes it possible to easily avoid dishing and erosion. Dishing is a term for polishing-created depressions from a given flat surface at the center section of wiring with a relatively large wiring width such as 100 microns which is embedded in an insulating material, where the wiring is formed by polishing a wafer by a metal wiring-attached damascene method, using an aqueous dispersion composition supplied during the polishing. Erosion refers to depressions from a given flat surface at a section of high wiring density, for example, a wiring section with a wiring width of 4.5 microns and an insulation width of 0.5 microns, having a 90% density at a 5 micron pitch. When dishing and erosion are extensive, burn-out occurs more readily and the device yield is impaired. Minimizing dishing and erosion is important in chemical machine polishing techniques for damascene.

DETAILED DESCRIPTION OF THE INVENTION

The invention will now be explained in further detail. (Polymer particles with a crosslinked structure and a aqueous dispersion containing it, and the like)

In the present invention, the aforementioned "polymer particles" have a "crosslinked structure". They therefore have higher hardness, and hence exhibit more excellent strength, than polymer particles with no crosslinked structure.

The "mean particle size" of the polymer particles is "0.13–0.8 µm", particularly 0.15–0.7 µm, and more preferably 0.15–0.5 µm. Aqueous dispersions containing polymer particles with a mean particle size within this range are stable, and because of the crosslinked structure of the polymer particles, such aqueous dispersions can be usefully applied for the purposes mentioned above.

The polymer particles may also have hydrophilic groups (hereunder referred to as "hydrophilic polymer particles"). Polymer particles with no hydrophilic groups (hereunder referred to as "hydrophobic polymer particles") have excellent moisture resistance, insulating properties heat resistance and color fastness and suitable hardness and strength, while hydrophilic polymer particles have excellent antistatic properties, heat resistance and color fastness, with suitable hardness and strength as well. Hydrophilic polymer particles also have excellent compatibility with polar group-containing compounds, so that more stable aqueous dispersions can be provided.

Hydrophilic polymer particles can be formed by introducing a hydrophilic group, such as a hydroxyl group, a carboxyl group or a salt thereof, an acid anhydride group, a sulfonic acid group or a salt thereof, a phosphoric acid group or a salt thereof or an amino group or a salt thereof, into the polymer constituent of the particles, at 0.1 millimole or greater and especially 1–100 millimoles, to 100 g of the polymer.

Such polymer particles having a crosslinked structure can be obtained by copolymerization of a crosslinkable monomer with another monomer. For the copolymerization, the crosslinkable monomer is used at 5–80 wt %, especially 5–60 wt % and more preferably 7–60 wt %. The other monomer is used at 20–95 wt %, especially 40–95 wt % and more preferably 40–93 wt %. If the crosslinkable monomer is used at less than 5 wt % it will not be possible to obtain polymer particles with sufficient hardness, while an excess of 80 wt % is not preferred because the polymer particles will be fragile despite high hardness. Such polymer particles with a crosslinked structure can also be converted to hydrophilic polymer particles by introduction of a hydrophilic group into the polymer.

Crosslinkable Monomer and Other Monomer

As crosslinkable monomers there may be used compounds with 2 or more polymerizable double bonds, including divinyl aromatic compounds such as divinylbenzene, and the like., or polyvalent acrylate compounds such as ethyleneglycol dimethacrylate, trimethylolpropane trimethacrylate, dethyleneglycol diacrylate, trimethylolpropane triacrylate, and the like.

The following may be mentioned as polyvalent acrylate polymers.

(1) Diacrylate compounds: polyethyleneglycol diacrylate, 1,3-butyleneglycol diacrylate, 1,6-hexaneglycol diacrylate, neopentylglycol diacrylate, polypropyleneglycol diacrylate, 2,2'-bis(4-acryloxypropyloxyphenyl)propane, 2,2'-bis(4-acryloxydiethoxyphenyl)propane, and the like.;
(2) Triacrylate compounds: trimethylolpropane triacrylate, trimethylolethane triacrylate, tetramethylolmethane triacrylate, and the like.;
(3) Tetraacrylate compounds: tetramethylolmethane tetraacrylate, and the like.;
(4) Dimethacrylate compounds: ethyleneglycol dimethacrylate, diethyleneglycol dimethacrylate, triethyleneglycol dimethacrylate, polyethyleneglycol dimethacrylate, 1,3-butyleneglycol dimethacrylate, 1,4-butyleneglycol dimethacrylate, 1,6-hexaneglycol dimethacrylate, neopentylglycol dimethacrylate, dipropyleneglycol dimethacrylate, polypropyleneglycol dimethacrylate, 2,2'-bis(4-methacryloxydiethoxyphenyl)propane, and the like.
(5) Trimethacrylate compounds: trimethylolpropane trimethacrylate, trimethylolethane trimethacrylate, and the like.;

And divinylbenzene, ethyleneglycol dimethacrylate and trimethylolpropane trimethacrylate are preferred among these crosslinkable monomers, and divinylbenzene is particularly preferred. These crosslinkable monomers may be used alone or in combinations of two or more.

The following may be mentioned as other monomers to be copolymerized with the crosslinkable monomer.
(1) Aromatic vinyl compounds: styrene, α-methylstyrene, p-methylstyrene, vinylxylene, monochlorstyrene, dichlorstyrene, monobromostyrene, dibromostyrene, fluorstyrene, p-tert-butylstyrene, ethylstyrene, vinylnaphthalene, and the like.;
(2) Unsaturated carboxylic acid compounds: maleic acid, fumaric acid, itaconic acid, acrylic acid, methacrylic acid, crotonic acid, and the like.;
(3) Unsaturated dicarboxylic anhydrides: maleic anhydride, itaconic anhydride, and the like.;
(4) Vinyl cyanide compounds: acrylonitrile, methacrylonitrile, and the like.;
(5) Acrylic acid esters: methyl acrylate, ethyl acrylate, propyl acrylate, butyl acrylate, amyl acrylate, hexyl acrylate, octyl acrylate, 2-ethylhexyl acrylate, cyclohexyl acrylate, dodecyl acrylate, octadecyl acrylate, phenyl acrylate, benzyl acrylate, and the like.;
(6) Methacrylic acid esters: methyl methacrylate, ethyl methacrylate, propyl methacrylate, butyl methacrylate, amyl methacrylate, hexyl methacrylate, octyl methacrylate, 2-ethylhexyl methacrylate, cyclohexyl methacrylate, dodecyl methacrylate, octadecyl methacrylate, phenyl methacrylate, benzyl methacrylate, and the like.;
(7) Unsaturated carboxylic amides: acrylamide, methacrylamide, and the like.;
(8) Conjugated diolefin compounds: butadiene, isoprene, and the like.

These other monomers may be used alone or in combinations of two or more. Also, two or more crosslinkable monomers may be copolymerized in combination with two or more other monomers.

There are no particular restrictions on the method of copolymerizing the crosslinkable monomer with the other monomer. For example, a polymer with a crosslinked structure may be obtained by copolymerization by any of various methods including solution polymerization, emulsion polymerization, suspension polymerization, and the like. The polymerization temperature, polymerization time and other polymerization conditions may be appropriately determined depending on the type of monomer used for copolymerization and its properties, such as the necessary molecular weight, and the like. The crosslinkable monomer may also be polymerized by being supplied at the start of polymerization, or it may be polymerized by being supplied at a stage in which the other monomer has already been polymerized to some extent.

The crosslinkable monomer used for the copolymerization is preferably present at 5–80 wt %, especially 5–60 wt % and more preferably 7–60 wt % of the total monomers. If the crosslinkable monomer is present at less than 5 wt % the resulting copolymer will not have sufficiently high hardness, while if the monomer is in excess of 80 wt % the copolymer will be fragile despite high hardness, and this is not a favorable condition for abrasive particles.

The copolymer with the crosslinked structure may be a random copolymer, graft copolymer or block copolymer. There is no limitation to copolymers of the crosslinkable monomer and the other monomer, as the crosslinkable monomer may be graft polymerized onto the surface or in the interior of polymer particles with no crosslinked structure, or graft copolymerization may be carried out with the crosslinkable monomer and the other monomer, to make polymer particles with a crosslinked structure. Particularly suitable for abrasive particles are polymer particles prepared by graft polymerization of the crosslinkable monomer onto polymer particles with a non-crosslinked structure, or graft copolymerization with the crosslinkable monomer and the other monomer, to form a crosslinked structure mainly on the surface thereof.

It is preferred to use spherical polymer particles. "Spherical" means roughly spherical with no acute angle portions, and not necessarily perfectly spherical.

Using spherical abrasive particles prevents, or at least minimizes, creation of scratches in polishing surfaces or surface roughening of polishing surfaces during polishing. The mean particle size of the polymer particles is 0.01–2.0 $\mu$m, especially 0.05–1.5 $\mu$m and more preferably 0.1–1.0 $\mu$m. If the mean particle size is too small or too large, the stability and polishing rate of the aqueous dispersion will be reduced. The mean particle size of the polymer particles is preferably 0.13–0.8 $\mu$m, since a mean particle size within this range can provide an aqueous dispersion with long term stability and a sufficient polishing rate.

The mean particle size can be measured by observation of the polymer particles with a transmission electron microscope, and it is preferably in the range of 0.15–0.6 $\mu$m, and especially 0.15–0.5 $\mu$m. By including in the aqueous dispersion polymer particles with this specific mean particle size obtained by copolymerization of the specified monomers, it is possible to prepare a high-performance CMP slurry for polishing of wafers.

It is normally preferred for the polymer particles to be contained in the aqueous dispersion or the CMP slurry at 0.1–30 wt %, especially 0.2–20 wt %, and more preferably 1–15 wt %. If the polymer particle content is less than 0.1 wt % sufficient polishing performance will not be achieved, and at greater than 30 wt % the stability of the aqueous dispersion will be reduced.

The aqueous dispersion may also contain only hydrophobic polymer particles or hydrophilic polymer particles, or it may contain these polymer particles in suitable content ratios.

Manufacturing Process for Polymer Particles

The process for production of the polymer particles is not particularly restricted, and it may be a process whereby an aqueous medium or organic solvent is used for polymerization, after which the resulting polymer is pulverized and sorted to the prescribed particle size, or a process whereby the monomer is finely dispersed in an aqueous medium during polymerization to make polymer particles with the prescribed particle size. When a surfactant is used during the polymerization, it is preferred for the resulting polymer particles to be washed with water and/or an organic solvent to minimize as little as possible the amount of residual surfactant in the polymer particles.

Further, the simplest process for production of the aqueous dispersion containing the polymer particles is one wherein an aqueous medium is used to prepare polymer particles with the prescribed particle size and this is directly used as the aqueous dispersion. By this process, however, it is not possible to eliminate the surfactant from the polymer particles. Consequently, when this process is employed it is necessary to reduce the amount of surfactant used for production of the polymer particles. However, after the produced polymer particles have been separated from the aqueous medium they can be redispersed in another medium to make an aqueous dispersion, and the surfactant thereby eliminated from the polymer particles.

After the aqueous medium or organic solvent has been used for copolymerization followed by drying, pulverization, and the like., the resulting powder may be redispersed in an aqueous medium to make an aqueous dispersion.

A Even when an organic solvent is used for the polymerization, so long as the resulting polymer is in particle form the organic solvent can be removed by distillation or the like and replaced with water or an aqueous medium to easily prepare an aqueous dispersion. The aqueous medium used may be water or a mixture of water and methanol, and the like., but water alone is preferred.

Surfactant

According to the present invention, a surfactant may be added for more even dispersion of the particles, particularly the polymer particles, in the aqueous dispersion or the CMP slurry. The surfactant content may be 0.15 wt % or lower, preferably 0.1 wt or lower, and more preferably 0.05 wt % or lower, with 0.01 wt % or lower being especially preferred. The surfactant is used in the step of production of the aqueous dispersion containing the polymer particles and will remain as an impurity in the polymer particles or the water or aqueous medium, and therefore a lower initial content can give an aqueous dispersion containing polymer particles with more excellent heat resistance, antistatic properties, color fastness, and the like.

Further, the surfactant included in the aqueous dispersion or CMP slurry is not greater than 0.05 part by weight and preferably not greater than 0.03 part by weight, with respect to 100 parts by weight of the polymer particles. It is more preferably not greater than 0.01 part by weight, and especially not greater than 0.025 part by weight. Such a composition will exhibit even better heat resistance, antistatic properties, color fastness, and the like.

By thus limiting the surfactant content to a small amount, it is possible to maintain the polishing performance while obtaining particles with excellent dispersability, so that faster polishing can be achieved without creating scratches in the polishing surfaces.

The surfactant used may be a cationic surfactant, anionic surfactant or nonionic surfactant. As cationic surfactants there may be mentioned aliphatic amines, aliphatic ammonium salts and the like. As anionic surfactants there may be mentioned carboxylic acid salts such as fatty acid soaps, alkylether carboxylic acid salts and the like; sulfonic acid salts such as alkylbenzenesulfonic acid salts, alkylnaphthalenesulfonic acid salts, $\alpha$-olefinsulfonic acid salts and the like; sulfonic acid ester salts such as higher alcohol sulfonic acid ester salts, alkylether sulfonic acid salts, polyoxyethylene alkylphenylethers and the like; phosphoric acid ester salts such as alkylphosphoric acid esters, and the like. As nonionic surfactants there may be mentioned ethers such as polyoxyethylene alkyl ethers; ether esters such as polyoxyethylene ethers of glycerin esters; and esters such as polyethyleneglycol fatty acid esters, glycerin esters, sorbitan esters, and the like.

Polymer Particle and Inorganic Particle, and Aqueous Dispersion and CMP Slurry Containing Them The aqueous dispersion or CMP slurry according to another present invention contains polymer particles and inorganic particles.

The "polymer particles" referred to above may be polymer particles composed of a thermoplastic resin, such as a polyvinyl chloride, polystyrene and styrene-based copolymer, a polyolefin such as polyacetal, saturated polyester, polyamide, polyimide, polycarbonate, polyethylene, polypropylene, poly-1-butene, poly-4-methyl-1-pentene or the like or an olefin copolymer, a phenoxy resin, a (meth)acrylic resin such as polymethyl methacrylate or an acrylic based copolymer.

The polymer particles used may also be composed of polymers with a crosslinked structure, obtained by copolymerization of styrene, methyl methacrylate or the like with divinylbenzene, ethyleneglycol dimethacrylate or the like. Further, the polymer particles used may also be composed of polymers with no crosslinked structure The polymer particles used may also be made of a thermosetting resin such as phenol resin, urethane resin, urea resin, melamine resin, epoxy resin, alkyd resin or unsaturated polyester resin.

Copolymers with hydrophilic functional groups as structural units, such as styrene-methacrylic acid copolymers or styrene-maleic anhydride copolymers, have excellent dispersability in water and are therefore preferred to facilitate preparation of the aqueous dispersion composition. Also, polyethylene, polypropylene, polystyrene or the like may be surface treated with oxygen plasma or the like to produce hydrophilic functional groups to improve the dispersion in water, for easier preparation of the aqueous dispersion composition.

The polymer particles functioning as an abrasive preferably have a globular shape. A globular shape means having a roughly globular shape with no acute angle sections, but it does not necessarily need to be nearly spherical. By using globular polymer particles it is possible to achieve polishing at a sufficient rate, while avoiding nicks in the polishing wafer surface during polishing.

The polymer particles used may be of a single type, or a combination of two or more types.

The "inorganic particles" mentioned above may be inorganic particles made of a metal oxide such as silica, alumina, titania, zirconia, ceria, iron oxide or manganese oxide. The inorganic particles used may be of a single type, or a combination of two or more types.

According to the present invention, a mean particle size of the polymer particles is not more than a mean particle size of the inorganic particles.

According to the present invention, the mean particle size of the polymer particles is preferably at least 0.01 $\mu$m and less than 5 $\mu$m, and the mean particle size of the inorganic particles is preferably greater than 0.01 $\mu$m and not greater than 5 $\mu$m. If these respective mean particle sizes are less than 0.01 $\mu$m or not greater than 0.01 $\mu$m, it may not be possible to obtain an aqueous dispersion composition with a sufficiently high polishing rate. On the other hand, if the respective mean particle sizes are not less than 5 $\mu$m or greater than 5 $\mu$m, the particles will tend to subside as sediment and separate out, thus hampering efforts to make a stable aqueous dispersion composition. The mean particle size of the polymer particles is especially preferred to be at least 0.05 $\mu$m and less than 1.0 $\mu$m, and more preferably at least 0.1 $\mu$m and less than 0.7 $\mu$m. The mean particle size of the inorganic particles is especially preferred to be greater than 0.05 $\mu$m and not greater than 1.0 $\mu$m, and more preferably greater than 0.1 $\mu$m and not greater than 0.7 $\mu$m. If the particle sizes are within these ranges, it will be possible to obtain an aqueous dispersion composition with a high polishing speed and no sedimentation or separation of the particles. The mean particle size can be measured by observation with a transmission electron microscope.

Here, the "mean particle size" is the size as present in water. Inorganic particles synthesized by a gas phase reaction method have a small primary particle size, and they often aggregate into secondary particles that disperse in the water. In such cases, the average size of the secondary particles is the mean particle size. The mean particle size can be measured by observation with a transmission electron microscope or by the dynamic light scattering method or laser diffractometry.

According to the present invention, the Sp/Si ratio is preferably 0.01–0.95, more preferably 0.05–0.9, and even more preferably 0.05–0.85. When the ratio of the mean particle sizes of the polymer particles and inorganic particles is within this range, it is possible to obtain an aqueous dispersion composition with a high polishing rate that avoids creating nicks in polishing wafer surfaces. If the Sp/Si ratio is less than 0.01, nicks may be created in the polishing wafer surfaces. If the Sp/Si ratio exceeds 1, i.e. if the mean particle size of the polymer particles exceeds the mean particle size of the inorganic particles, the polishing rate tends to be particularly low. This tendency is particularly notable when the Sp/Si ratio is less than 1 and Si is less than 0.1 $\mu$m.

Further, the aqueous dispersion, the CMP slurry or particularly the CMP slurry used for wafer polishing and the like according to another present invention contains polymer particles and inorganic particles, wherein the mean particle size of the inorganic particles is 0.1–1.0 $\mu$m, and is smaller than the mean particle size of the polymer particles.

For the present invention, the mean particle size of the inorganic particles is preferably 0.12–0.8 $\mu$m, more preferably 0.12–0.5 $\mu$m, and even more preferably 0.15–0.4 $\mu$m. If the mean particle size is less than 0.1 $\mu$m it may not be possible to obtain an aqueous dispersion composition with a sufficient polishing rate. On the other hand, if the mean particle size exceeds 1.0 $\mu$m the particles will tend to subside as sediment and separate out, thus hampering efforts to make a stable aqueous dispersion composition. The mean particle size may be measured by observation with a transmission electron microscope, as explained above.

According to the present invention, the mean particle size of the inorganic particles is less than the mean particle size of the polymer particles, and the Sp/Si ratio is preferably 1.1–20, more preferably 1.1–15, even more preferably 1.1–10 and especially 1.1–5. If the ratio of the mean particle sizes of the polymer particles and inorganic particles is within this range, it is possible to obtain an aqueous dispersion composition with a high polishing rate that avoids creating nicks in polishing wafer surfaces. A Sp/Si ratio of greater than 20 is not preferred because this tends to lower the polishing rate.

According to each above-mentioned invention, the hardness of the polymer particles is more preferably selected as appropriate depending on the hardness of the working film. For example, in the case of working films made of aluminum or the like having low hardness, it is preferred to use an aqueous dispersion composition containing polymer particles with a relatively low hardness. On the other hand, in the case of working films of high hardness such as tungsten, it is preferred to use an aqueous dispersion composition containing polymer particles with a high degree of crosslinking.

The content of the polymer particles and inorganic particles may be 0.1–30 parts by weight each to 100 parts by weight of the aqueous dispersion composition, with 0.5–20 parts by weight and especially 0.5–15 parts by weight being preferred. The total amount of the polymer particles and inorganic particles may be 0.2–31 parts by weight, especially 0.5–25 parts by weight, and more preferably 1.0–20 parts by weight. The respective contents of the polymer particles and inorganic particles or their total are preferably not less than the minimums given above, since this will not give an aqueous dispersion composition with a sufficient polishing rate. On the other hand, they are preferably not included in excess of the aforementioned maximums, since this will reduce the stability of the aqueous dispersion composition.

The method for producing aqueous dispersion composition containing the polymer particles is most conveniently a method whereby an aqueous medium is used for polymerization of a prescribed monomer, or for copolymerization with other monomers if necessary, and the aqueous medium containing the resulting polymer particles is directly used as the aqueous dispersion composition. The aqueous dispersion composition may also be prepared by a method whereby an aqueous medium or organic solvent is used for polymerization followed by drying, pulverization, and the like., after which the resulting powder is redispersed in the aqueous medium. Even when an organic solvent has been used for polymerization, an aqueous dispersion composition can be easily produced by solvent substitution with an aqueous medium by distillation or the like, if a particular polymer is to be produced.

The aqueous dispersion containing the inorganic particles can also be produced by a method such as described in the specification of Japanese Patent Application No. hei-9-214035 or No. hei-9-238969. For example, it may be produced by a method whereby the inorganic particles are added to distilled water while stirring and kneading with a kneader, and after completing the addition, the kneading procedure and dispersing procedure are continued and the resulting slurry is diluted with ion-exchange water or the like, and if necessary, the coarse particles are subsequently removed.

The aqueous dispersion of the present invention can be prepared by producing an aqueous dispersion containing the polymer particles, and then adding the inorganic particles to this aqueous dispersion. It can also be prepared by producing an aqueous dispersion containing the inorganic particles, and then adding the polymer particles to the aqueous dispersion. Alternatively, it may be prepared by mixing an aqueous dispersion containing the polymer particles and an aqueous dispersion containing the inorganic particles, and this preparation method is preferred for its convenience. The medium used for the aqueous dispersion may be water, or a mixed medium of water and methanol, for example, with water as the main component, but water alone is particularly preferred.

Aqueous Dispersion, Various Additive of CMP Slurry and Wafer Surface Polishing Process According to the present invention, the aqueous dispersion or CMP slurry may also contain, if necessary, various other additives (for example, oxidizing agents, polyvalent metal ion, organic acids, surfactants, pH regulators, and the like.) in addition to the surfactant. Such addition can increase the polishing rate, stabilize the oxidizing agent, and adjust for differences in the polishing rate when polishing films of different hardness, as in cases where two or more working films are polished.

Inclusion of potassium hydroxide or ammonia allows polishing of insulating films, and inclusion of tungsten, aluminum, copper and the like allows polishing of metal films. The composition (particularly a CMP slurry) can also be used in combination with another composition (especially a CMP slurry) in an appropriate weight ratio.

Oxidizing Agent

The "oxidizing agent" used is not particularly restricted so long as it is water-soluble, and it is preferably selected as appropriate depending on the electrochemical properties of the metal layer of the film target and the like of the wafer, based on a Pourbaix diagram, for example.

As specific oxidizing agents there may be mentioned organic peroxides such as hydrogen peroxide, peracetic acid, perbenzoic acid, tert-butylhydroperoxide, and the like.; permanganate compounds such as potassium permanganate, and the like.; bichromate compounds such as potassium bichromate, and the like.; halogenate compounds such as potassium iodate, and the like.; nitric compounds such as nitric acid, iron nitrate, and the like.; perhalogenate compounds such as perchloric acid, and the like.; transition metal salts such as potassium ferricyanide, and the like.; persulfuric compounds such as ammonium persulfate, and the like.; polyvalent metal salts such as iron nitrate, cerium ammonium nitrate, and the like.; and heteropoly acids such as silicotungstic acid, phosphotungstic acid, silicomolybdic acid, phosphomolybdic acid, and the like. Two or more of these may also be used in combination. Among these, hydrogen peroxide and organic peroxides are particularly preferred because they contain no metal elements and their decomposition products are harmless. By including such oxidizing agents it is possible to vastly increase the polishing rate for polishing of metal layers, and particularly of target films of semiconductor devices.

The oxidizing agent content maybe 0.1–15 parts by weight, and is particularly preferred to be 0.3–10 parts by weight and especially 0.5–8 parts by weight, with respect to 100 parts by weight of the aqueous dispersion. When this content is less than 0.1 part, the polishing rate of the aqueous dispersion will not be adequately enhanced, while, when it is included at greater than 15 parts by weight, it is possible to adequately increase the polishing rate and it is not necessary to be preferably included in large quantities such as greater than 15 parts by weight.

Polyvalent Metal Ion

A polyvalent metal ion may also be added. As polyvalent metal ions there may be mentioned metal ions of aluminum, titanium, vanadium, chromium, manganese, iron, cobalt, nickel, copper, zinc, germanium, zirconium, molybdenum, tin, antimony, tantalum, tungsten, lead and cerium. One single species may be used, or two or more polyvalent metal ions may be used together. Particularly preferred as polyvalent metal ions are one or more metal ions of aluminum, titanium, chromium, manganese, iron, copper, zinc, tin and cerium, because they allow an even higher polishing rate. And among them, iron ion or copper ion is particularly preferred. Further, the metal salt comprising the polyvalent metal ion is one or more from among nitric acid salts, sulfuric acid salts, acetic acid salts and gluconic acid salts of aluminum, nitric acid salts, sulfuric acid salts, acetic acid salts and gluconic acid salts of iron (III), and nitric acid salts, sulfuric acid salts, acetic acid salts and gluconic acid salts of copper (II). And these nitric acid salts of iron (III), and the like are act as an oxidizing agent, too.

The polyvalent metal ion content in the aqueous dispersion is preferably 3–3000 ppm. The content is more preferably 10–2000 ppm, and especially 30–1000 ppm. The polyvalent metal ion has an effect of promoting the function of the oxidizing agent, and When the content of the polyvalent metal ion is less than 3 ppm, the promoting effect will be insufficient and the polishing rate will not be adequately increased. It is also not preferred for the polyvalent metal ion to be added at greater than 3000 ppm because the film targets of semiconductor devices will be contaminated by the metal ion.

The polyvalent metal ion can be produced by adding to the aqueous medium a salt or complex, such as a sulfate or acetate salt, containing a polyvalent metal element, or it may be produced by adding an oxide of a polyvalent metal element. Even a compound that produces a monovalent metal ion when added to the aqueous medium may be used, so long as the ion is converted to a polyvalent metal ion by the oxidizing agent.

Organic Acid

The "organic acid" can further improve the polishing rate. As organic acids there may be mentioned para-toluenesulfonic acid, dodecylbenzenesulfonic acid, isoprenesulfonic acid, gluconic acid, lactic acid, citric acid, tartaric acid, malic acid, glycolic acid, malonic acid, formic acid, oxalic acid, succinic acid, fumaric acid, maleic acid and phthalic acid. Among these, gluconic acid, lactic acid, citric acid, tartaric acid, malic acid, glycolic acid, malonic acid, formic acid, oxalic acid, succinic acid, fumaric acid, maleic acid and phthalic acid are preferred. Among these, tartaric acid, malic acid, succinic acid and phthalic acid are particularly preferred. These organic acids may be used alone or in combinations of two or more. As inorganic acids there may be mentioned nitric acid, hydrochloric acid and sulfuric acid, and these inorganic acids may also be used alone or in combinations of two or more. Combinations of organic acids and inorganic acids may also be used. These acids can be used at 0.1–10 parts by weight and especially 1–8 parts by weight to 100 parts by weight of the aqueous dispersion composition. An acid content in the range of 0.1–10 parts by weight is preferred to give an aqueous dispersion composition with excellent dispersability and sufficient stability, as well as minimal etching and an increased polishing rate.

pH Adjustment

According to the present invention, addition of an alkali metal hydroxide, ammonia, an inorganic alkali salt, an inorganic acid or an organic acid for adjustment of the pH can improve the dispersability and stability of the aqueous dispersion composition. Ammonia, inorganic alkali salts and inorganic acids are particularly preferred.

As alkali metal hydroxides there may be used sodium hydroxide, potassium hydroxide, rubidium hydroxide, cesium hydroxide and the like. Sodium hydroxide and potassium hydroxide are particularly preferred among these. As inorganic acids there may be used nitric acid, sulfuric acid phosphoric acid or the like, and as organic acids there may be used formic acid, acetic acid, oxalic acid, malonic acid, succinic acid, benzoic acid or the like. Nitric acid and sulfuric acid are commonly used. Adjustment of the pH of the aqueous dispersion composition can improve the dispersability while also increasing the polishing rate, and the pH is preferably determined as appropriate in consideration of the electrochemical properties of the working surface, the dispersability and stability of the polymer particles and the polishing rate.

Chemical Mechanical Polishing

The working film subjected to chemical mechanical polishing according to the present invention may be a silicon oxide film, amorphous silicon film, polycrystalline silicon film, single-crystal silicon film, silicon nitride film, pure tungsten film, pure aluminum film or pure copper film, or an alloy film of tungsten, aluminum or copper with another metal, formed on a wafer during manufacture of a semiconductor device such as a VLSI or the like. The working film may also be an oxide or nitride film of a metal such as tantalum or titanium.

When the polishing surface of the working film on the wafer is a metal, the polishing rate can be vastly improved by adding an oxidizing agent to the aqueous dispersion composition. The oxidizing agent used may be appropriately selected by a Pourbaix diagram, for example, based on the electrochemical properties of the working surface.

The polymer particles contained in the aqueous dispersion used for chemical mechanical polishing of working films on wafers are preferably selected as appropriate depending on the hardness of the working film. For example, in the case of working films made of aluminum or the like having low hardness, it is preferred to use an aqueous dispersion containing polymer particles with a relatively low hardness. On the other hand, in the case of working films of high hardness such as tungsten, it is necessary to use an aqueous dispersion containing polymer particles of relatively high hardness provided by a high degree of crosslinking.

The chemical mechanical polishing of the working film on the wafer using the aqueous dispersion composition of the present invention can be accomplished with a commercially available chemical mechanical polishing device (such as Model "LGP510" or "LGP552" by Lapmaster SFT CO., LTD.), which has been used in conventional methods employing metal oxide particles as abrasive particles.

After the polishing, it is preferred to remove the residual polymer particles remaining on the polishing surface. The particle removal can be accomplished by a common washing method, and the polishing surface can be heated at high temperature in the presence of oxygen to burn the polymer particles for their removal. As specific methods for burning there may be mentioned exposure to oxygen plasma, or ashing treatment with plasma whereby oxygen radicals are supplied in a downflow; these allow the residual polymer particles to be easily removed from the polishing surface.

Process for Manufacture of a Semiconductor Device

The manufacturing process of the present invention is a process for manufacture of a semiconductor device using the above prescribed CMP slurry. Here, "semiconductor device" is used in a wide sense to include polished wafers, various devices provided with or bearing such wafers, and various device provided with plates manufactured from such wafers (i.e., devices on which such plates are mounted).

PREFERRED MODE OF THE INVENTION

The present invention will now be explained in further detail by way of examples. Throughout the examples, "parts" will represent "parts by weight", unless otherwise specified. The mean particle sizes of the polymer particles were determined by measuring the particle sizes of 200 polymer particles with a transmission electron microscope and taking the averages.

[I] In Case of Using Polymer Particles with a Crosslinked Structure

Table 1 shows a summary of the test results for the examples and comparative examples described below.
(1) Production of Aqueous Dispersion Example 1A After loading 576 parts of distilled water, 0.5 part of a nonionic surfactant (trade name "Triton X-100", product of Rohm and Haas Corp.) and 1.0 part of 2,2'-azobis(2-methylpropionitrile) (trade name "V-60", product of Wako Junyaku, CO., LTD.) in a 4-necked polymerization flask, the mixture was stirred for 10 minutes to complete dissolution. Addition of 100 parts of styrene was then followed by 5 minutes of stirring while purging the flask with nitrogen gas.

Reaction was then carried out at 70° C. for 12 hours, and after cooling to room temperature, the solution was filtered and the aggregates were removed to obtain an aqueous dispersion containing styrene polymer particles. The total solid portion of the aqueous dispersion was 14.2%. After then loading 70 parts of the aqueous dispersion, 929 parts of distilled water and 1.0 part of ammonium persulfate into a flask, the mixture was stirred for 10 minutes to dissolve the ammonium persulfate. Next, 90 parts of styrene and 10 parts of 55% purity divinylbenzene (with the remainder ethylvinylbenzene) were added, and stirring was continued for 5 minutes while purging particles was 0.35 μm. The surfactant content of the aqueous dispersion was 0.1 wt %.

EXAMPLE 3A

After polymerization in the same manner as Example 2A, 3 parts of methyl methacrylate and 2 parts of methacrylic acid were added while maintaining a temperature of 70° C., and polymerization was carried out for 2 hours to obtain an aqueous dispersion containing spherical polymer particles having carboxyl groups introduced as hydrophilic groups in the polymer on the particle surfaces. The total solid portion of the aqueous dispersion was 20.2 wt %, and the mean particle size of the spherical polymer particles was 0.36 μm. The surfactant content of the aqueous dispersion was 0.1 wt %.

TABLE 1

| Example/Comp. Ex. No. | Polymer etc. | Surfactant concentration (wt %) | Particle size (μm) | Polishing rate (Å/min) | Scratches (no.) |
|---|---|---|---|---|---|
| Ex. 1A | ST/DVB | Nonion (0.005) | 0.35 | 110 (W) | None |
| Ex. 2A | ST/MA/DVB | Anion (0.1) | 0.35 | 630 (W) | None |
| Ex. 3A | ST/MA/DVB-MMA/MA | Anion (0.1) | 0.35 | 510 (W) | None |
| Comp. Ex. 1A | ST/MA/MMA | Anion (0.1) | 0.35 | 22 (W) | None |
| Comp. Ex. 2A | ST/MA/DVB | Anion (2.2) | 0.05 | 8 (W) | None |
| Exp. 1B | ST/DVB | Nonion (0.005) | 0.35 | 1300 (Ni) | None |
| Exp. 2B (Comparative) | Colloidal Silica | None | 0.02 | 1280 (Ni) | Presence |
| Exp. 3B (Comparative) | Colloidal Silica | None | 0.19 | 1450 (Ni) | Presence |
| Ex. 2C | ST/DVB | Nonion (0.005) | 0.35 | 900 (W) | None |
| Comp. Ex. 2C | ST | Anion (0.014) | 0.39 | 600 (W) | None |
| Comp. Ex. 4C | ST/MA | Anion (0.2) | 0.283 | 40 (W) | None |
| Comp. Ex. 6C | Silica (fumed method) | None | 0.23 | 1800 (W) | 426 |
| Comp. Ex. 8C | Alumina (fumed method) | None | 0.16 | 2300 (W) | 2083 |
| Ex. 4C | MMA/DVB (with amino group) | Cation (0.001) | 0.38 | 5900 (Cu) | 600Å (Dishing) 550Å (Erosion) |
| Comp. Ex. 9C | Silica | None | 0.23 | 2900 (Cu) | 1900Å (Dishing) 2200Å (Erosion) | the flask with nitrogen gas. Reaction was then carried out at 70° C. for 12 hours, and after cooling to room temperature, the mixture was filtered and the aggregates were removed to obtain an aqueous dispersion containing spherical polymer particles composed of styrene/divinylbenzene copolymer. The total solid portion of the aqueous dispersion was 9.6 wt %, and the mean particle size of the polymer particles was 0.35 μm. The surfactant content of the aqueous dispersion was 0.005 wt %.

EXAMPLE 2A

After loading 360 parts of distilled water, 15 parts of styrene and 5 parts of methacrylic acid in a 4-necked polymerization flask, the mixture was heated to 70° C. while purging with nitrogen gas, at which point 20 parts of a 5% aqueous ammonium persulfate solution was added and first stage polymerization was carried out for one hour. Next, an emulsion prepared by combining 50 parts of styrene, 30 parts of 55% purity divinylbenzene (with the remainder ethylvinylbenzene) and 0.5 part of a surfactant (potassium dodecylbenzenesulfonate) with 40 parts of distilled water was continuously added thereto over a period of 2 hours and polymerization was continued for 3 hours, to obtain an aqueous dispersion containing spherical polymer particles composed of styrene/methacrylic acid/divinylbenzene copolymer. The total solid portion of the aqueous dispersion was 19.4 wt %, and the mean particle size of the polymer

COMPARATIVE EXAMPLE 1A

An aqueous dispersion containing spherical polymer particles composed of styrene/methacrylic acid/methyl methacrylate copolymer was obtained in the same manner as Example 2, except that 30 parts of methyl methacrylate was used instead of the 55% purity divinylbenzene in Example 2A. The total solid portion of the aqueous dispersion was 19.4 wt %, and the mean particle size of the spherical polymer particles was 0.35 μm. The surfactant content of the aqueous dispersion was low at 0.1 wt %. However, there was a problem in that since the polymer particles had no crosslinked structure they exhibited poor heat resistance, while their solvent resistance was also inadequate, and it was not possible to achieve a sufficient polishing rate due to the low hardness of the polymer particles when the aqueous dispersion was used as a polishing material.

COMPARATIVE EXAMPLE 2A

After loading 800 parts of distilled water in which 20 parts of a surfactant (sodium dodecylbenzenesulfonate) had been dissolved, 65 parts of styrene, 30 parts of 55% purity divinylbenzene (with the remainder ethylvinylbenzene) and 5 parts of methacrylic acid in a 4-necked polymerization flask, the mixture was heated to 70° C. while purging with nitrogen gas, at which point 20 parts of a 5% aqueous ammonium persulfate solution was added and polymerization was carried out for 4 hours to obtain an aqueous dispersion containing spherical polymer particles composed of styrene/methacrylic acid/divinylbenzene copolymer. The total solid portion of the aqueous dispersion was 11.0 wt %, and the mean particle size of the polymer particles was 0.05 μm. The surfactant content of the aqueous dispersion was high at 2.2 wt %. Consequently, when this aqueous dispersion was used as a polishing material, foaming made it difficult to handle and the polishing rate was also low.

(2) Chemical Mechanical Polishing of Tungsten Working Film

A substrate prepared by forming a 5000-angstrom thick tungsten film by sputtering on the surface of a silica film formed on a silicon substrate was set in a chemical mechanical polishing device (Model "EPO-113", product of Ebara Laboratories, Co., Ltd.), and a porous polyurethane polishing pad was used for polishing with a load of 150 g/cm$^2$. To the urethane pad surface there was supplied a CMP slurry prepared by adding an aqueous iron nitrate solution and water to the each aqueous dispersion of Example 1A, 2A, 3A and Comparative Example 1A, 2A, with the polymer particle concentration adjusted to 3 wt % and the iron nitrate concentration to 3 wt %, at a rate of 200 cc/min.

The thickness of the tungsten film of the polished, washed and dried substrate was measured with an electric conducting film thickness meter, and the polishing rate was calculated. And a summary of these results is shown in Table 1. After the silica film formed on the silicon substrate was polished, washed and dried under the same conditions, no scratches were detected in all cases upon measurement of the scratches with a KLA (Model "KLA2112", product of KLA Tencor Corp.).

(3) Polishing of Magnetic Disk Plate

Experimental Examples 1B–3B

Water was used for dilution of the polymer particles in the aqueous dispersion obtained in Examples 1A to 5 wt % concentration, and then aluminum nitrate was added to the dilution as a polishing accelerator to a 5 wt % concentration to obtain a polishing material. For comparison, polishing materials were also prepared with the same composition but containing 5 wt % of colloidal silica (trade name: "Snowtex 20", product of Nissan Chemical Industries, Co., Ltd.) or fumed silica (trade name: "Aerosil #90", product of Nihon Aerosil, CO., LTD.).

These polishing materials were used for polishing of a Ni-P electroless plated 3.5-inch aluminum magnetic disk plate (already subjected to one step of polishing), and the polishing rates and condition of polishing scratches were evaluated.

<Polishing Conditions>

Polymer device: Model "LM-15C" by Lapmaster SFT CO., LTD.

Polishing pad: Trade name: "Polytex DG", by Rodel Corp. (U.S.)

Working load: 70 g/cm$^2$

Plate rotation speed: 50 rpm

Polishing material supply rate: 15 ml/min.

Polishing time: 10 minutes

<Evaluation method>

Polishing rate: The polishing rate was determined by the following equation, based on the weight reduction of the disk by polishing.

Polishing rate (nm/min)=[(W/d)/S]×10$^7$

W=disk weight reduction per minute
d=Ni-P electroless plating density
S=polishing wafer surface area Polishing scratches: After washing and drying of the polished disk, it was placed under a spotlight in a dark room and the presence or absence of scratches was visually observed.

The results of the evaluation are shown in Table 1.

(4) Wafer polishing

Table 1 shows a summary of the test results for the examples and comparative examples described below.

EXAMPLE 1C

Production of CMP Slurry Containing Crosslinked Polymer Particles

After loading 576 parts of distilled water, 0.5 part of a nonionic surfactant (trade name "Triton X-100", product of Rohm and Haas Corp.) and 1.0 part of 2,2'-azobis( 2-methylpropionitrile) (trade name "V-60", product of Wako Pure Chemical Industries, Ltd.) in a 4-necked polymerization flask, the mixture was stirred for 10 minutes to complete dissolution. Addition of 100 parts of styrene was then followed by 5 minutes of stirring while purging the flask with N$_2$ gas.

Reaction was then carried out at 70° C. for 12 hours, and after cooling to room temperature, the solution was filtered and the aggregates were removed to obtain an aqueous dispersion containing styrene polymer particles. The total solid portion of the aqueous dispersion was 14.2%. After then loading 70 parts of the aqueous dispersion, 929 parts of distilled water and 1.0 part of ammonium persulfate into a flask, the mixture was stirred for 10 minutes to dissolve the ammonium persulfate. Next, 90 parts of styrene and 10 parts of divinylbenzene were added, and stirring was continued for 5 minutes while purging the flask with N$_2$ gas. Reaction was then carried out at 70° C. for 12 hours, and after cooling to room temperature, the mixture was filtered and the aggregates were removed to obtain an aqueous dispersion containing spherical polymer particles composed of styrene/divinylbenzene copolymer. The total solid portion of the aqueous dispersion was 9.6%, and the mean particle size of the polymer particles was 0.35 μm.

EXAMPLE 2C

Chemical Mechanical Polishing of Tungsten Working Film

A substrate prepared by forming a 5000-angstrom thick tungsten film by sputtering on the surface of a silica film formed on a silicon substrate was set in a chemical mechanical polishing device (Model "EPO-113", product of Ebara Corp.), and a porous polyurethane polishing pad was used for polishing with a load of 150 g/cm$^2$. To the urethane pad surface there was supplied a CMP slurry prepared by adding an aqueous iron nitrate solution and water to the aqueous dispersion of Example 1C, with the polymer particle concentration adjusted to 3 wt % and the iron nitrate concentration to 3 wt %, at a rate of 200 cc/min.

The thickness of the tungsten film of the polished, washed and dried substrate was measured with an electric conducting film thickness meter, and the polishing rate was calculated. As a result it was determined that the polishing rate was 900 angstroms/min. After the silica film formed on the silicon substrate was polished, washed and dried under the same conditions, no scratches were detected upon measurement of the scratches with a KLA (Model "KLA2112", product of KLA Tencor Corp.).

COMPARATIVE EXAMPLE 1C

Production of CMP Slurry Containing Non-crosslinked Polymer Particles

After loading 600 parts of distilled water, 0.1 part of ammonium lauryl sulfate and 0.6 part of ammonium persulfate in a 4-necked polymerization flask, the mixture was stirred for 10 minutes to complete dissolution. This was followed by addition of 100 parts of styrene, and then 5 minutes of stirring while purging the flask with $N_2$ gas.

After reaction at 80° C. for 4 hours the solution was cooled to room temperature, after which the solution was filtered and the aggregates were removed to obtain an aqueous dispersion containing styrene polymer particles. The total solid portion of the aqueous dispersion was 14.4%. The mean particle size of the spherical polymer particles was 0.39 μm. To 100 parts of this aqueous dispersion there was then added 44 parts of ion-exchange water to make an aqueous dispersion with a total solid portion of 10%.

COMPARATIVE EXAMPLE 2C

Chemical Mechanical Polishing of Tungsten Working Film

A tungsten working film was subjected to chemical mechanical polishing in the same manner as Example 2C, except that the aqueous dispersion for chemical mechanical polishing used was prepared by adding an aqueous iron nitrate solution and water to the aqueous dispersion obtained in Comparative Example 1C with the polymer particle concentration adjusted to 3 wt % and the iron nitrate concentration to 3 wt %, the load was 300 g/cm$^2$ and the rotational polishing rate was 100 rpm. As a result, the polishing rate as calculated in the same manner as Example 2C was 600 angstroms/min. After a silica film formed on the silicon substrate was polished, washed and dried under the same conditions, the scratches were measured in the same manner as Example 2C, and no scratches were detected.

COMPARATIVE EXAMPLE 3C

Production of CMP Slurry Containing Non-crosslinked Polymer Particles

After loading 400 parts of distilled water, 0.1 part of ammonium lauryl sulfate and 0.6 part of ammonium persulfate in a 4-necked polymerization flask, the mixture was stirred for 10 minutes to complete dissolution. This was followed by addition of 9.5 parts of styrene and 0.5 part of methacrylic acid, and then 5 minutes of stirring while purging the flask with $N_2$ gas.

After reaction at 75° C. for 2 hours, a mixture of 88 parts of styrene and 2 parts of methacrylic acid was added dropwise to the flask over 3 hours, and after completion of the dropwise addition, reaction was carried out at 75° C. for 3 hours and the solution was cooled to room temperature, after which the solution was filtered and the aggregates were removed to obtain an aqueous dispersion containing styrene/methacrylic acid copolymer particles. The solid portion of the aqueous dispersion was 19.9%. The mean particle size of the spherical polymer particles was 0.283 μm. To 100 parts of this aqueous dispersion there was then added 99 parts of ion-exchange water to make an aqueous dispersion with a total solid portion of 10%.

COMPARATIVE EXAMPLE 4C

Chemical Mechanical Polishing of Tungsten Working Film

A tungsten working film was subjected to chemical mechanical polishing in the same manner as Example 4C, except that the aqueous dispersion for chemical mechanical polishing used was prepared by adding an aqueous iron nitrate solution and water to the aqueous dispersion obtained in Comparative Example 3C with the polymer particle concentration adjusted to 3 wt % and the iron nitrate concentration to 3 wt %. As a result, the polishing rate as calculated in the same manner as Example 2C was 40 angstroms/min. After a silica film formed on the silicon substrate was polished, washed and dried under the same conditions, the scratches were measured in the same manner as Example 2C, and no scratches were detected.

COMPARATIVE EXAMPLE 5C

Production of CMP Slurry Containing Inorganic Particles

Six kg of fumed silica (trade name "Aerosil #50", product of Nihon Aerosil, CO., LTD . . . ) was continuously added over a period of 30 minutes to 8 kg of distilled water in a planetary-type kneader (Model "TK Hibis Dispermix HDM-3D-20, product of Tokushu Kika Kogyo Co., Ltd.) having the liquid-contacting sections of the stirrer and container coated with a urethane resin, while kneading by rotation of a twisting blade at 10 rpm for the main rotating axis and 30 rpm for the secondary rotation axis. This was followed by one hour of simultaneously performing a kneading procedure whereby the twisting blade was rotated at a secondary rotation axis speed of 30 rpm with a total solid portion of 43% and dispersion treatment whereby an 80-mm diameter Cores high-speed rotating blade was rotated at a secondary rotation axis speed of 2000 rpm, with a main rotation axis speed of 10 rpm for both.

The resulting slurry was diluted with ion-exchange water to obtain an aqueous colloid containing silica at a total solid portion of 30%. This was then treated with a depth cartridge filter with a pore size of 1 μm to remove the coarse grains. The mean particle size of the secondary particles of silica in the aqueous dispersion was 0.23 μm.

Comparative Example 6C

Chemical Mechanical Polishing of Tungsten Working Film

A tungsten working film was subjected to chemical mechanical polishing in the same manner as Example 2C, except that the aqueous dispersion for chemical mechanical polishing used was prepared by adding an aqueous iron nitrate solution and water to the aqueous dispersion obtained in Comparative Example 5C with the polymer particle concentration adjusted to 3 wt % and the iron nitrate concentration to 3 wt %. As a result, the polishing rate as calculated in the same manner as Example 2C was 1800 angstroms/min. After a silica film formed on the silicon substrate was polished, washed and dried under the same conditions, the scratches were measured in the same manner as Example 2C, and 426 scratches were detected.

Comparative Example 7C

Production of CMP Slurry Containing Inorganic Particles

An aqueous dispersion was obtained in the same manner as Comparative Example 5C, except that fumed alumina ("Aluminium Oxide C", trade name of Degussa AG) was used instead of fumed silica. The mean particle size of the alumina in the aqueous dispersion was 0.16 μm.

COMPARATIVE EXAMPLE 8C

Chemical Mechanical Polishing of Tungsten Working Film

A tungsten working film was subjected to chemical mechanical polishing in the same manner as Example 2C, except that the aqueous dispersion for chemical mechanical polishing used was prepared by adding an aqueous iron nitrate solution and water to the aqueous dispersion obtained in Comparative Example 7C with the polymer particle concentration adjusted to 3 wt % and the iron nitrate concentration to 3 wt %. As a result, the polishing rate as calculated in the same manner as Example 2C was 2300 angstroms/min. After a silica film formed on the silicon substrate was polished, washed and dried under the same conditions, the scratches were measured in the same manner as Example 2C, and 2083 scratches were detected.

EXAMPLE 3C

Production of CMP Slurry Containing Crosslinkable Polymer Particles

After loading 400 parts of distilled water, 0.02 part of a cationic emulsifier ("Coatamine 24P", trade name of Kao, CO., LTD . . . ), 20 parts of methyl methacrylate and 4 parts of an azo-based polymerization initiator ("V50", trade name of Wako Pure Chemical Industries, Ltd.) in a 4-necked polymerization flask, the mixture was heated to 70° C. while stirring under a nitrogen gas atmosphere, for 2 hours of polymerization. This was followed by continuous addition of 72 parts of methyl methacrylate and 8 parts of divinylbenzene over a period of 3 hours, and continued polymerization at 80° C. for 3 hours. After then cooling to room temperature, the solution was filtered and the aggregates were removed to obtain an aqueous dispersion containing methyl methacrylate polymer particles with amino groups on the particle surfaces. The total solid portion of the aqueous dispersion was 19.9%. The mean particle size of the spherical polymer particles was 0.38 μm.

EXAMPLE 4C

Chemical Mechanical Polishing of Copper Working Film

Various additives were combined with the aqueous dispersion obtained in Example 3C to a polymer particle concentration of 5 wt %, with hydrogen peroxide added at 0.3 wt % and 7-hydroxy-5-methyl-1,3,4-triazaindazoline added at 0.1% as a planarizing agent, and the mixture was adjusted to pH 8.5 with KOH, to obtain an aqueous dispersion for chemical mechanical polishing.

When a patterned copper film wafer SKW6-2 (product of SKW Associates) was polished under conditions with an IC1000/SUBA400 (product of Rodel-Nitta, Co., Ltd.) as the polishing pad and using an EPO-113 chemical mechanical polishing device (product of Ebara Corp.) while supplying the aforementioned aqueous dispersion for chemical mechanical polishing at 200 ml/min and with a pressure of 300 g/cm$^2$, the polishing rate was 5900 angstroms/min. The dishing with a 100 micron wiring width at the exact point was 600 angstroms, and the 90% density erosion at a 5 micron pitch was also satisfactory at 550 angstroms.

Upon polishing under conditions of 50% over polishing, the dishing with a 100 micron wiring width was 900 angstroms and the 90% density erosion at a 5 micron pitch was 820 angstroms, and therefore the over polishing margin was also satisfactory.

COMPARATIVE EXAMPLE 9C

Chemical Mechanical Polishing of Copper Working Film by CMP Slurry Containing Silica Particles Polishing was performed in the same manner as Example 10C, except that the fumed silica prepared in Comparative Example 3C was added at 5% instead of the polymethyl methacrylate particles with amino groups in the CMP slurry used for Example 10C.

As a result, the polishing rate was relatively low at 2900 angstroms/min and the dishing with a 100 micron wiring width at the exact point was 1900 angstroms, while the 90% density erosion at a 5 micron pitch was a poor level of 2200 angstroms.

(5) Effect of the Examples

According to the results shown in Table 1, the each CMP slurries and the each polishing methods of Examples 1A–3A, Experimental Example 1B and Examples 1C–4C contained low amounts of surfactant impurities, and also gave excellent polishing rates. They also produced fewer polishing scratches and allowed higher quality polishing than the polishing by means of the CMP slurries containing inorganic particles (Comparative Examples 6C, 8C). Superior polishing results were also achieved for all of the working metal surfaces of nickel (Experimental Example 1B), tungsten (Examples 1A, 2A, 3A, and 2C) and copper (Example 4C).

When the surfactant concentration was high as in Comparative Examples 2A and Comparative Examples 4C, this has presented the problem of a vastly reduced polishing rate.

With the CMP slurry employing the aqueous dispersion of Example 1A (Experimental Example 1B), the polishing rate was high and absolutely no polishing scratches were detected. On the other hand, with the CMP slurries containing inorganic particles (Experimental Examples 2B, 3B), the polishing rates were adequate but numerous polishing scratches of considerable size were detected, thus demonstrating a problem in practical terms.

[II] In Case of Containing Polymer Particles and Inorganic Particles

Table 2 shows a summary of the test results for Examples 2D, 4D, 6D, 8D, 10D, 12D and 14D and Comparative Examples 2D, 4D, 6D, 8D, 10D and 12D (the sizes of the particles used, the Sp/Si ratio and evaluation of the polishing performance).

(1) Production of Aqueous Dispersion (CMP slurry) and the Polishing Performance

Production Example 1D

Production of Aqueous Dispersion Containing Polymer Particles

After loading 576 parts of distilled water, 2.0 parts of a non-ionic surfactant (trade name "Triton X-100", product of Rohm and Haas Corp.) and 1.0 part of 2,2'-azobis(2-methylpropionitrile) (trade name "V-60", product of Wako Pure Chemical Industries, Ltd.) in a 4-necked polymerization flask,

TABLE 2

| Example/ Comp. Ex. No. | Polymer etc. | Polymer Particle size (µm) | Inorganic Particle size (µm) | Sp/Si rate | Polishing rate (Å/min) | Scratches (no.) |
| --- | --- | --- | --- | --- | --- | --- |
| Ex. 2D | ST/DVD | 0.15 | 0.24 | 0.63 | 1600 (W) | 42 |
| Ex. 4D | ST/DVD | 0.15 | 0.18 | 0.83 | 3100 (W) | 77 |
| Ex. 6D | ST/MMA | 0.183 | 0.24 | 0.76 | 1700 (W) | 44 |
| Ex. 8D | ST/MMA | 0.239 | 0.18 | 1.33 | 4300 (W) | 18 |
| Ex. 10D | ST | 0.39 | 0.24 | 1.63 | 2000 (W) | 30 |
| Ex. 12D | ST/MMA | 0.183 | 0.24 | 0.76 | 4500 (Cu) | 800Å (D) 700Å (E) |
| Ex. 14D | ST/MMA | 0.183 | 0.24 | 0.76 | 3900 (Al) | 600Å (D) 550Å (E) |
| Ex. 16D | ST | 0.34 | 0.24 | 1.42 | 3200 (W) | 3 |
| Comp. Ex. 2D | Silica sol | 0.15 | 0.01–0.02 | 7.5–15 | 950 (W) | 8 |
| Comp. Ex. 4D | Alumina sol | 0.239 | 0.01–0.02 | 12–24 | 900 (W) | 12 |
| Comp. Ex. 6D | Silica | — | 0.24 | — | 1900 (W) | 646 |
| Comp. Ex. 8D | Alumina | — | 0.18 | — | 2500 (W) | 2332 |
| Comp. Ex. 10D | Silica | — | 0.24 | — | 1200 (Cu) | 2800Å (D) 1800Å (E) |
| Comp. Ex. 12D | Alumina (humed) | — | 0.18 | — | 670 (Al) | 1800Å (D) 1400Å (E) | the mixture was stirred for 10 minutes to complete dissolution. Addition of 100 parts of styrene was then followed by 5 minutes of stirring while purging the flask with $N_2$ gas.

Reaction was then carried out at 70° C. for 12 hours, and after cooling to room temperature, the solution was filtered and the aggregates were removed to obtain an aqueous dispersion containing styrene polymer particles. The solid portion of the aqueous dispersion was 14.2%. After then loading 70 parts of the aqueous dispersion, 929 parts of distilled water and 1.0 part of ammonium persulfate into a flask, the mixture was stirred for 10 minutes to dissolve the ammonium persulfate. And then, 90 parts of styrene and 10 parts of divinylbenzene were added, and stirring was continued for 5 minutes while purging the flask with $N_2$ gas. Reaction was then carried out at 70° C. for 12 hours, and after cooling to room temperature, the mixture was filtered and the aggregates were removed to obtain an aqueous dispersion containing globular polymer particles composed of styrene/divinylbenzene copolymer. The mean particle size of the polymer particles was 0.15 µm.

PRODUCTION EXAMPLE 2D

Production of Aqueous Dispersion Composition Containing Inorganic Particles

Twenty kg of fumed silica (trade name "Aerosil #50", product of Nihon Aerosil, Co., Ltd.) was continuously added to 27 kg of distilled water in a planetary-type kneader (Model "TK Hibis Dispermix HDM-3D-20, product of Tokushu Kika Kogyo Co., Ltd.) having the liquid-contacting sections of the stirrer and container coated with a urethane resin, while kneading by rotation of a twisting blade at 18 rpm for the main rotating axis and 36 rpm for the secondary rotation axis. This was followed by one hour of simultaneously performing a kneading procedure whereby the twisting blade was rotated at a secondary rotation axis speed of 54 rpm with a total solid portion of 43% while, and dispersion treatment whereby an 80-mm diameter Cores high-speed rotating blade was rotated at a secondary rotation axis speed of 2700 rpm, with a main rotation axis speed of 10 rpm for both.

The resulting slurry was diluted with ion-exchange water to obtain an aqueous colloid containing silica at a total solid portion of 30%. This was then treated with a depth cartridge filter with a pore size of 1 µm to remove the coarse grains. The mean particle size of the secondary particles of silica in the aqueous dispersion was 0.24 µm.

EXAMPLE 1D

Preparation of CMP Slurry

A mixture of 100 parts of the polymer particle aqueous dispersion obtained in Production Example 1D, 100 parts of the silica aqueous dispersion obtained in Production Example 2D, 100 parts of a 20% aqueous iron (III) nitrate solution and 700 parts of ion-exchange water was stirred to obtain an aqueous dispersion composition for chemical machine polishing to be used for wafer manufacture.

EXAMPLE 2D

Chemical Machine Polishing of Tungsten Working Film

A substrate prepared by forming a 5000-angstrom thick tungsten film by CVD on the surface of a silica film formed on a silicon substrate was set in a chemical machine polishing device (Model "EPO-113", product of Ebara$_{13}$ Corp.), and a porous polyurethane polishing pad was used for polishing with a load of 250 g/cm². The urethane pad surface was subjected to 3 minutes of polishing at 30 rpm while supplying the aqueous dispersion composition of Example 1 at a rate of 200 cc/min.

The thickness of the tungsten film of the polished, washed and dried substrate was measured with an electric conducting film thickness meter, and upon calculation of the polishing rate it was determined that polishing had been performed at a rate of 1600 angstroms/min. The silicon film formed on the silicon substrate was polished, washed and dried under the same conditions, and 42 scratches were detected with a KLA (Model "KLA2112", product of KLA Tencor Corp.).

PRODUCTION EXAMPLE 3D

Production of Aqueous Dispersion Composition Containing Inorganic Particles

An aqueous dispersion with a 30% total solid portion was obtained in the same manner as Production Example 2D, except that 17 kg of fumed alumina (trade name "Aluminum Oxide C", product of Degussa AG) was used instead of fumed silica. The mean particle size of the alumina in the aqueous dispersion composition was 0.18 µm.

EXAMPLE 3D

Preparation of Aqueous Dispersion Composition for Chemical Machine Polishing

A mixture of 100 parts of the polymer particle aqueous dispersion obtained in Production Example 1, 150 parts of the alumina aqueous dispersion obtained in Production Example 2D, 100 parts of a 20% aqueous iron (III) nitrate solution and 650 parts of ion-exchange water was stirred to obtain a CMP slurry to be used for wafer polishing.

EXAMPLE 4D

Chemical Machine Polishing of Tungsten Working Film

The CMP slurry obtained in Example 3D was used for chemical machine polishing of a tungsten working film in the same manner as Example 2D, except that the load was 300 g/cm$^2$ and the rotational polishing rate was 100 rpm. As a result, the polishing rate as calculated in the same manner as Example 2D was 3100 angstroms/min. A silicon film formed on the silicon substrate was polished, washed and dried under the same conditions, and 77 scratches were detected in the same manner as Example 2D.

PRODUCTION EXAMPLE 4D

Production of Aqueous Dispersion Composition Containing Polymer Particles

After loading 400 parts of distilled water, 0.1 parts of ammonium lauryl sulfate and 0.6 parts of ammonium persulfate in a 4-necked polymerization flask, the mixture was stirred for 10 minutes to complete dissolution. This was followed by addition of 8.5 parts of styrene and 1.5 parts of methacrylic acid, and then 5 minutes of stirring while purging the flask with N$_2$ gas.

After reaction at 750° C. for 2 hours, a mixture of 88 parts of styrene and 2 parts of methacrylic acid was added dropwise to the flask over 3 hours, and after completion of the dropwise addition, reaction was carried out at 75° C. for 3 hours and the solution was cooled to room temperature, after which the solution was filtered and the aggregates were removed to obtain aqueous dispersion containing styrene/methacrylic acid copolymer particles. The solid portion of the aqueous dispersion was 19.8%. The mean particle size of the globular polymer particles was 0.183 µm.

EXAMPLE 5D

Preparation of CMP Slurry

After mixing 100 parts of the silica aqueous dispersion obtained in Production Example 2D, 167 parts of hydrogen peroxide and 658 parts of ion-exchange water with 75 parts of the polymer particle aqueous dispersion obtained in Production Example 4D.

EXAMPLE 6D

Chemical Machine Polishing of Tungsten Working Film

The CMP slurry obtained in Example 5D was used for chemical machine polishing of a tungsten working film in the same manner as Example 4D. As a result, the polishing rate as calculated in the same manner as Example 2D was 1700 angstroms/min. A silica film formed on the silicon substrate was polished, washed and dried under the same conditions, and 44 scratches were detected in the same manner as Example 2D.

Production Example 5D

Production of Aqueous Dispersion Containing Polymer Particles

An aqueous dispersion containing styrene/methacrylic acid copolymer particles was obtained in the same manner as Production Example 4D, except that the loading amounts of the styrene and methacrylic acid in the first step were 9.5 parts and 0.5 parts, respectively. The solid portion of the aqueous dispersion was 19.5%. The mean particle size of the globular copolymer particles was 0.239 µm.

EXAMPLE 7D

Preparation of CMP Slurry

After mixing 150 parts of the alumina aqueous dispersion obtained in Production Example 3D, 100 parts of a 20% aqueous iron (III) nitrate solution and 700 parts of ion-exchange water with 50 parts of the polymer particle aqueous dispersion obtained in Production Example 5D, the mixture was stirred to obtain an aqueous dispersion composition for chemical machine polishing to be used for wafer polishing.

EXAMPLE 8D

Chemical Machine Polishing of Tungsten Working Film

The CMP slurry obtained in Example 7D was used for chemical machine polishing of a tungsten working film in the same manner as Example 4D. As a result, the polishing rate as calculated in the same manner as Example 2D was 4300 angstroms/min. A silica film formed on the silicon substrate was polished, washed and dried under the same conditions, and 18 scratches were detected in the same manner as Example 2D.

PRODUCTION EXAMPLE 6D

Production of Aqueous Dispersion Containing Polymer Particles

After loading 600 parts of distilled water, 0.1 parts of ammonium lauryl sulfate and 0.6 parts of ammonium persulfate in a 4-necked polymerization flask, the mixture was stirred for 10 minutes to complete dissolution. This was followed by addition of 100 parts of styrene and then 5 minutes of stirring while purging the flask with N$_2$ gas.

After reaction at 80° C. for 4 hours the solution was cooled to room temperature, and was then filtered and the aggregates were removed to obtain an aqueous dispersion containing styrene polymer particles. The solid portion of the aqueous dispersion was 14.4%. The mean particle size of the globular polymer particles was 0.39 µm.

EXAMPLE 9D

Preparation of CMP Slurry

A mixture of 100 parts of the polymer particle aqueous dispersion obtained in Production Example 6D, 100 parts of the silica aqueous dispersion obtained in Production Example 2D, 100 parts of a 20% aqueous iron (III) nitrate solution and 700 parts of ion-exchange water was stirred to obtain a CMP slurry to be used for wafer polishing.

EXAMPLE 10D

Chemical Machine Polishing of Tungsten Working Film

The CMP slurry obtained in Example 9D was used for chemical machine polishing of a tungsten working film in the same manner as Example 4D. As a result, the polishing rate as calculated in the same manner as Example 2D was 2000 angstroms/min. A silica film formed on the silicon substrate was polished, washed and dried under the same conditions, and 30 scratches were detected in the same manner as Example 2D.

COMPARATIVE EXAMPLE 1D

Preparation of CMP Slurry

After mixing 150 parts of a commercially available silica sol (trade name "Snowtex O", particle size: 10–20 nm, total solid portion: 20%, product of Nissan Chemical Industries, Ltd.), 100 parts of a 20% aqueous iron (III) nitrate solution and 650 parts of ion-exchange water with 100 parts of the polymer particle aqueous dispersion obtained in Production Example 1D, the mixture was stirred to obtain an aqueous dispersion composition for chemical machine polishing to be used for wafer polishing.

COMPARATIVE EXAMPLE 2D

Chemical Machine Polishing of Tungsten Working Film

The CMP slurry obtained in Comparative Example 1D was used for chemical machine polishing of a tungsten working film in the same manner as Example 2D. As a result, the polishing rate as calculated in the same manner as Example 2D was 950 angstroms/min. A silica film formed on the silicon substrate was polished, washed and dried under the same conditions, and 8 scratches were detected in the same manner as Example 2D.

COMPARATIVE EXAMPLE 3D

Preparation of CMP Slurry

After mixing 150 parts of a commercially available alumina sol (trade name "Aluminasol-520", particle size: 10–20 nm, total solid portion: 21%, product of Nissan Chemicals, Industries, Ltd.), 100 parts of a 20% aqueous iron (III) nitrate solution and 700 parts of ion-exchange water with 50 parts of the polymer particle aqueous dispersion obtained in Production Example 5D, the mixture was stirred to obtain an aqueous dispersion composition for chemical machine polishing to be used for wafer polishing.

COMPARATIVE EXAMPLE 4D

Chemical Machine Polishing of Tungsten Working Film

The CMP slurry obtained in Comparative Example 3D was used for chemical machine polishing of a tungsten working film in the same manner as Example 4D. As a result, the polishing rate as calculated in the same manner as Example 2D was 900 angstroms/min. A silica film formed on the silicon substrate was polished, washed and dried under the same conditions, and 12 scratches were detected in the same manner as Example 2D.

COMPARATIVE EXAMPLE 5D

Preparation of CMP Slurry

A mixture of 100 parts of the silica aqueous dispersion obtained in Production Example 2D, 100 parts of a 20% aqueous iron (III) nitrate solution and 800 parts of ion-exchange water was stirred to obtain a CMP slurry to be used for wafer polishing.

COMPARATIVE EXAMPLE 6D

Chemical Machine Polishing of Tungsten Working Film

The aqueous dispersion composition for chemical machine polishing obtained in Comparative Example 5D was used for chemical machine polishing of a tungsten working film in the same manner as Example 4D. As a result, the polishing rate as calculated in the same manner as Example 2D was 1900 angstroms/min. A silicon film formed on the silicon substrate was polished, washed and dried under the same conditions, and 646 scratches were detected in the same manner as Example 2D.

COMPARATIVE EXAMPLE 7D

Preparation of CMP Slurry

A mixture of 250 parts of the alumina aqueous dispersion obtained in Production Example 3D, 100 parts of a 20% aqueous iron (III) nitrate solution and 650 parts of ion-exchange water was stirred to obtain an aqueous dispersion composition for chemical machine polishing to be used for wafer polishing.

COMPARATIVE EXAMPLE 8D

Chemical Machine Polishing of Tungsten Working Film

The CMP slurry obtained in Comparative Example 7D was used for chemical machine polishing of a tungsten working film in the same manner as Example 4D. As a result, the polishing rate as calculated in the same manner as Example 2D was 2500 angstroms/min. A silica film formed on the silicon substrate was polished, washed and dried under the same conditions, and 2332 scratches were detected in the same manner as Example 2D.

EXAMPLE 11D

Preparation of CMP Slurry

With 75 parts of the 0.183 micron styrene/MMA copolymer particle aqueous dispersion obtained in Production Example 4D there were combined 100 parts of the 0.24 micron silica dispersion of Production Example 2D, 10 parts of 30% hydrogen peroxide, 10 parts of ammonium lactate and 805 parts of ion-exchange water to obtain a CMP slurry for copper.

EXAMPLE 12D

Chemical Machine Polishing of Copper Working Film

When the CMP slurry obtained in Example 11D was used for polishing of a patterned copper film wafer SKW6-2

(product of SKW Co.), the polishing rate was 4500 angstroms/min. The dishing with a 100 micron wiring width at the exact point was a satisfactory level of 800 angstroms, and the 90% density erosion at a 5 micron pitch was also satisfactory at 700 angstroms.

EXAMPLE 13D

Preparation of CMP Slurry

With 25 parts of the 0.183 micron, 20% solid portion styrene/MMA copolymer particle aqueous dispersion obtained in Production Example 4D there were combined 100 parts of the 0.18 micron, 30% solid portion fumed alumina dispersion of Production Example 3D and 875 parts of ion-exchange water to obtain a CMP slurry for aluminum. Because the average particles after mixing were aggregates of styrene/MMA copolymer particles and alumina particles, the mean particle size was 0.51 μm.

EXAMPLE 14D

Chemical Machine Polishing of Aluminum Working Film

When the aqueous dispersion composition for chemical machine polishing obtained in Example 13D was used for polishing of a 100 micron line-and-space patterned, 15,000-angstrom thick aluminum film wafer, the polishing rate was 3900 angstroms/min. The dishing with a 100 micron wiring width at the exact point was a satisfactory level of 600 angstroms. The 90% density erosion at a 5 micron pitch was also satisfactory at 550 angstroms.

COMPARATIVE EXAMPLE 9D

Preparation of CMP Slurry

With 100 parts of the 0.24 micron silica dispersion of Production Example 2D there were combined 10 parts of 30% hydrogen peroxide, 10 parts of ammonium lactate and 880 parts of ion-exchange water to obtain a CMP slurry for copper.

COMPARATIVE EXAMPLE 10D

Chemical Machine Polishing of Copper Working Film

When the aqueous dispersion composition for chemical machine polishing obtained in Comparative Example 9D was used for polishing of the patterned copper film wafer SKW6-2 (product of SKW Corp.), the polishing rate was a low level of 1200 angstroms/min. The dishing with a 100 micron wiring width at the exact point was 2800 angstroms, which is an inferior practical level. The 90% density erosion at a 5 micron pitch was also an inferior level of 1800 angstroms.

COMPARATIVE EXAMPLE 1D

Preparation of CMP Slurry

With 100 parts of the 0.18 micron, 30% solid portion fumed alumina dispersion of Production Example 3D there was combined 900 parts of ion-exchange water to obtain a CMP slurry for aluminum.

COMPARATIVE EXAMPLE 12D

Chemical Machine Polishing of Aluminum Working Film

When the CMP slurry obtained in Comparative Example 11D was used for polishing of a 15,000-angstrom thick aluminum film-formed wafer with a 100 micron line-and-space pattern and patterned wiring with a 90% density at a 5 micron pitch, the polishing rate was an impractical level of 670 angstroms/min. The dishing with a 100 micron wiring width at the exact point was 1800 angstroms, which is an inferior practical level. The 90% density erosion at a 5 micron pitch was also an inferior level of 1400 angstroms.

PRODUCTION EXAMPLE 7D

Production of Polymethyl Methacrylate Particle

After loading 100 parts of methyl metacrylate, 4 parts of ago compound of a polymerization initiator (trade name "V-50", product of Wako Pure Chemical Industries, Ltd.)and 400 parts of ion-exchange water in a flask of capacity of 2 liters, mixing and warming up to 70° C. under the atmosphere of nitriding gas, the mixture was polymerized for 7 hours. By the above method, polymethyl methacrylate particle of the mean particle size of 0.34 μm having amino group on the surface of the particles was obtained.

EXAMPLE15D

Preparation of CMP Slurry

After loading 50 parts of an aqueous dispersion of the polymer particle obtained in Production Example 7D, 100 parts of the silica aqueous dispersion obtained in Production Example 2D, 10 parts of a 10% aqueous iron (III) nitrate solution and 20 parts of a 10% malonic acid in 920 parts of ion-exchange water, the mixture was stirred to obtain a CMP slurry to be used for wafer polishing.

EXAMPLE 16D

Chemical Machine Polishing of Tungsten Working Film

The CMP slurry obtained in Example 15D was used for chemical machine polishing of a tungsten working film in the same manner as Example 2D. As a result, the polishing rate was 3200 angstroms/min. 3 scratches were detected and the number of the scratches was very low level.

(2) Effect of the Examples

According to the results shown in Table 2, the CMP slurries and polishing methods of Examples 1D–16D gave excellent polishing rates and few numbers of scratches. Superior polishing results were also achieved for all of the working metal surfaces of tungsten (Examples 2D, 4D, 6D, 8D, 10D and 16D), copper (Example 12D) and aluminum (Examples 14D).

On the other hand, when a Sp/Si ratio is large (Comparative Examples 2D, 4D), polishing rates are small. And cases of the CMP slurries containing inorganic particles (Comparative Examples 6D, 8D, 10D, 12D), the polishing rates were adequate but numerous polishing scratches of considerable size were detected, thus demonstrating a problem in practical terms.

What is claimed is:

1. A polishing process for wafer surfaces characterized by using an aqueous dispersion composition for chemical mechanical polishing that contains polymer particles with a crosslinked structure and a mean particle size of 0.13–0.8 μm, for polishing of a working film formed on a wafer surface.

2. A polishing process for wafer surfaces according to claim 1, wherein said polymer is produced by copolymerization of 5–80 wt % of a crosslinkable monomer and 20–95 wt % of another monomer.

3. A polishing process for wafer surfaces according to claim 2, wherein said composition further comprises a surfactant component in an amount not greater than 0.05 wt %.

4. A polishing process for wafer surfaces according to claim 2, wherein said polymer particles have a hydrophilic group.

5. A polishing process for wafer surfaces according to claim 4, wherein said hydrophilic group is at least one from among hydroxyl, carboxyl groups and salts thereof, acid anhydride groups, sulfonic acid groups and salts thereof, phosphoric acid groups and salts thereof, and amino groups and salts thereof.

6. A polishing process for wafer surfaces according to claim 2, wherein said aqueous dispersion composition for chemical mechanical polishing also contains an oxidizing agent and/or a polyvalent metal ion.

7. A polishing process for wafer surfaces according to claim 6, wherein said aqueous dispersion composition for chemical mechanical polishing also contains an organic acid.

8. A polishing process for wafer surfaces according to claim 2, wherein said working film is a film selected from the group consisting of a silicon oxide film, an amorphous silicon film, a polycrystalline silicon film, a single-crystal silicon film, a silicon nitride film, a pure tungsten film, a pure aluminum film, a pure copper film, an alloy film of tungsten with another metal, an alloy film of aluminum with another metal, an alloy film of copper with another metal, a tantalum oxide film, a titanium oxide film, a tantalum nitride film, and a titanium nitride film, formed on a wafer.

9. A polishing process for wafer surfaces, comprising:
   polishing a working film formed on a wafer surface with an aqueous dispersion composition for chemical mechanical polishing which contains polymer particles and inorganic particles, wherein the mean particle size of said polymer particles is not more than the mean particle size of said inorganic particles.

10. A polishing process for wafer surfaces according to claim 9, wherein said mean particle size of said polymer particles is not less than 0.01 $\mu$m and less than 5 $\mu$m, and said mean particle size of said inorganic particles is greater than 0.01 $\mu$m and not more than 5 $\mu$m.

11. A polishing process for wafer surfaces according to claim 10, wherein said working film is a film selected from the group consisting of a silicon oxide film, an amorphous silicon film, a polycrystalline silicon film, a single-crystal silicon film, a silicon nitride film, a pure tungsten film, a pure aluminum film, a pure copper film, an alloy film of tungsten with another metal, an alloy film of aluminum with another metal, an alloy film of copper with another metal, a tantalum oxide film, a titanium oxide film, a tantalum nitride film, and a titanium nitride film, formed on a wafer.

12. A polishing process for wafer surfaces according to claim 10, wherein said aqueous dispersion composition for chemical mechanical polishing further contains an oxidizing agent and/or polyvalent metal ion.

13. A polishing process for wafer surfaces according to claim 12, wherein said aqueous dispersion composition for chemical machine polishing further contains an organic acid.

14. A process for manufacture of a semiconductor device, comprising:
   polishing a working film on the semiconductor device with an aqueous dispersion composition for chemical mechanical polishing which contains polymer particles having a crosslinked structure and a mean particle size of 0.13–0.8 $\mu$m.

15. A process for manufacture of a semiconductor device according to claim 14, wherein said composition further comprises a surfactant component in an amount not greater than 0.15 wt %.

16. A process for manufacture of a semiconductor device, comprising:
   polishing a working film on the semiconductor device with an aqueous dispersion composition for chemical mechanical polishing which contains polymer particles and inorganic particles, wherein the mean particle size of said polymer particles is not more than the mean particle size of said inorganic particles.

17. A process for manufacture of a semiconductor device, comprising:
   polishing a working film on the semiconductor device with an aqueous dispersion composition for chemical mechanical polishing which contains polymer particles and inorganic particles, wherein the mean particle size of said inorganic particles is 0.01–1.0 $\mu$m, and is smaller than said mean particle size of said polymer particles.

* * * * *